United States Patent
Kwon et al.

(10) Patent No.: US 7,705,409 B2
(45) Date of Patent: Apr. 27, 2010

(54) HIGH VOLTAGE TRANSISTORS

(75) Inventors: Oh-kyum Kwon, Gyeonggi-do (KR); Yong-chan Kim, Gyeonggi-do (KR); Joon-suk Oh, Seoul (KR); Myung-hee Kim, Gyeonggi-do (KR); Hye-young Park, Seoul (KR)

(73) Assignee: Samsung Electronics Co., Ltd. (KR)

(*) Notice: Subject to any disclaimer, the term of this patent is extended or adjusted under 35 U.S.C. 154(b) by 92 days.

(21) Appl. No.: 12/014,244

(22) Filed: Jan. 15, 2008

(65) Prior Publication Data

US 2008/0185664 A1    Aug. 7, 2008

(30) Foreign Application Priority Data

Feb. 2, 2007    (KR) .................. 10-2007-0011251

(51) Int. Cl.
*H01L 29/78* (2006.01)

(52) U.S. Cl. ............... 257/402; 257/500; 257/E29.255

(58) Field of Classification Search ............... 257/402, 257/E29.255, 500, 288, 410, E21.427
See application file for complete search history.

(56) References Cited

U.S. PATENT DOCUMENTS

| | | | |
|---|---|---|---|
| 7,061,029 | B1 | 6/2006 | Lee et al. |
| 2003/0030105 | A1 | 2/2003 | Nishibe et al. |
| 2004/0178454 | A1 | 9/2004 | Kuroda et al. |
| 2005/0045983 | A1* | 3/2005 | Noda et al. .................. 257/500 |
| 2006/0163623 | A1 | 7/2006 | Noda et al. |
| 2007/0018258 | A1 | 1/2007 | Chen et al. |

FOREIGN PATENT DOCUMENTS

| | | |
|---|---|---|
| JP | 2004-128401 | 4/2004 |
| KR | 1020050009797 A | 1/2005 |
| KR | 1020050010152 A | 1/2005 |
| KR | 1020050104163 A | 2/2005 |

OTHER PUBLICATIONS

Extended European Search Report, European Patent Application No. 08 000 819.6, Jun. 25, 2009, 7 pages.

* cited by examiner

*Primary Examiner*—Thomas L Dickey
*Assistant Examiner*—Fazli Erdem
(74) *Attorney, Agent, or Firm*—Myers Bigel Sibley & Sajovec

(57) ABSTRACT

Some embodiments of the present invention provide high voltage transistors including a semiconductor substrate and a device isolation film defining an active region in the semiconductor substrate. A gate electrode extends along a central portion of the active region while maintaining a predetermined width on the semiconductor substrate. A second well is formed on both sides of the gate electrode in the semiconductor substrate, and partially extends to a bottom surface of the device isolation film. The active region in the semiconductor substrate comprises a first active region disposed under the gate electrode, and separating the device isolation film and a second active region defined by the first active region and the device isolation film. Methods of manufacturing high voltage transistors are also provided.

15 Claims, 5 Drawing Sheets

HIGH VOLTAGE TRANSISTORS

CLAIM OF PRIORITY

This application claims priority under 35 U.S.C. §119 to Korean Patent Application No. 10-2007-0011251, filed on Feb. 2, 2007 in the Korean Intellectual Property Office (KIPO), the content of which is hereby incorporated herein by reference as if set forth in its entirety.

FIELD OF THE INVENTION

The present invention relates to a semiconductor devices and methods of manufacturing the same, and more particularly to, high voltage transistors and methods of manufacturing the same

BACKGROUND OF THE INVENTION

Complementary metal oxide silicon (CMOS) driven at low voltages and logic element devices driven at high voltages can be combined on a single semiconductor substrate. When driven at a high voltage, these devices may have high breakdown voltages for the operation at the high voltage. In order to obtain the high breakdown voltage, a density of an impurity doped into a well formed in the semiconductor substrate is typically decreased.

Referring to FIGS. 1A and 1B, a plan view illustrating a structure of a conventional high voltage transistor and a cross section illustrating the high voltage transistor taken along a line 1B-1B' of FIG. 1A will be discussed. The cutaway line 1B-1B' is drawn partially along an active region 30 and a device isolation film 20 for convenience of description. As illustrated in FIGS. 1A and 1B, a first well 12 doped with an impurity of a first conductivity type, for example, a p-type, is formed in a semiconductor substrate 10. A device isolation film 20 forming a field region defines an active region 30. A gate electrode 42 is formed on the semiconductor substrate 10 by interposing a gate insulating film 40 in a central portion of the active region 30. Furthermore, second wells 14 doped with an impurity of the second conductivity type, for example, an n-type, opposite to the first conductivity type are disposed in both sides of the gate electrode 42. The second well 14 is diffused partially to lower portions of the device isolation film 20 and the gate electrode 42.

A source/drain region 16 separated from the gate electrode 42 by a predetermined distance is formed within the second well 14, and a silicide layer 18 may be formed on the source/drain region 16 for improving conductivity. The source/drain region 16 is doped with an impurity of the second conductivity at a high density. The doping density of the second well 14 is relatively higher than that of the first well 12 but relatively lower than that of the source/drain region 16.

Meanwhile, the high voltage transistor uses a driving voltage of 30 volts or higher for its distinctive property. The high driving voltage causes a change in a profile of the doping density of the first well 12 having the relatively low doping density. Moreover, segregation of the impurity within the first well 12 occurs when performing a succeeding heat treatment. For example, in case of an NMOS transistor, the segregation of boron (B) of the first conductivity type occurs in succeeding heat treatment, so that a density of the boron is decreased at an edge of the device isolation film 20.

The segregation may result in a weak inversion at a portion a of the second well 14 intruding to the lower portion of the device isolation film 20 or a portion b of the device isolation film 20 contacting the active region 30. In other words, the segregation of the impurity causes the weak inversion, which then forms a parasitic MOS transistor in the portion a intruding to the lower portion of the device isolation film 20 out of the lower portion of the device isolation film 20 or the portion b of the device isolation film 20 contacting the active region 30.

Referring now to FIG. 2, a graph plotting a relation of a drain current $I_d$ versus a gate voltage $V_g$ in order to check an influence of a parasitic transistor with respect to the conventional high voltage transistor will be discussed. It was measured that a back bias voltage $V_b$ was varied from 0.0V to −3.0V. Furthermore, wafers used for the experiment were selected by random sampling, in which a wafer corresponding to thick solid lines was denoted by A, and a wafer corresponding to thin solid lines was denoted by B. Portions involving humps were emphasized by a rectangle c.

As illustrated, an off current $I_{off}$ of the wafer A was roughly 0.08 pA/μm, a threshold voltage $V_{th}$ was roughly 1.08V, and a saturated drain current $I_{d(sat)}$ was roughly 344 μA/μm, so that relatively slight hump was occurred. However, an off current $I_{off}$ of the wafer B was roughly 97.12 pA/μm, a threshold voltage $V_{th}$ was roughly 1.09V and a saturated drain current $I_{d(sat)}$ was roughly 346 μA/μm, so that the hump greater than that of the wafer A was produced. Since the wafers were selected by the random sampling, a relatively great hump may be occurred in a certain wafer. The hump caused by the parasitic transistor possibly produces a great leakage current. The parasitic transistor may result in a sub-threshold leakage current in some excessive cases.

SUMMARY OF THE INVENTION

Some embodiments of the present invention provide high voltage transistors including a semiconductor substrate and a device isolation film defining an active region in the semiconductor substrate. A gate electrode extends along a central portion of the active region while maintaining a predetermined width on the semiconductor substrate. A second well is formed on both sides of the gate electrode in the semiconductor substrate, and partially extends to a bottom surface of the device isolation film. The active region in the semiconductor substrate comprises a first active region disposed under the gate electrode, and separating the device isolation film and a second active region defined by the first active region and the device isolation film.

In further embodiments of the present invention, the device isolation film may be deep enough to carry out device isolation.

In still further embodiments the device isolation film may include a high density plasma (HDP) oxide film.

In some embodiments of the present invention, the gate electrode may be provided on an entire surface of the first active region.

In further embodiments of the present invention, the second well partially extends to both lower portions of the gate electrode.

In still further embodiments, a width and a length of the first active region may be determined by a type of the transistor.

In some embodiments of the present invention, an upper surface of the first active region may be level with an upper surface of the second active region.

In further embodiments of the present invention, source and drain regions may be separated from the gate electrode within the second well. The second well and the source and drain regions may be doped with an impurity having a same conductivity type. In certain embodiments the impurity may include a group 5 element in the periodic table.

In still further embodiments of the present invention, the transistor may include a first well including the active region and the device isolation film in an upper portion of the semiconductor substrate. The impurity doped into the first well may have a conductivity type opposite to that of the second well. In certain embodiments, the impurity may be a group 3 element in the periodic table, for example, the impurity may be boron (B). A doping density of the second well may be greater than that of the first well.

Although some embodiments of the present invention are discussed above with respect to transistors, related methods of fabricating transistors are also provided herein.

DETAILED DESCRIPTION OF EMBODIMENTS

Figure 1A:
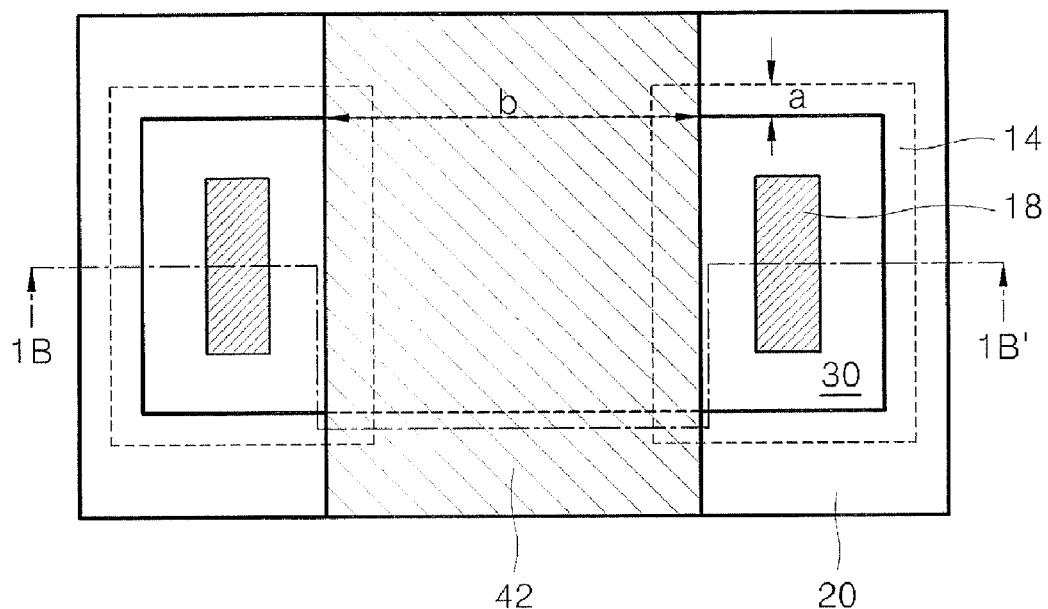
FIG. 1A is a plan view illustrating a structure of a conventional high voltage transistor.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Some embodiments of the present invention will now be discussed with respect to FIGS. 3A through 8. Embodiments of high voltage transistors according to some embodiments of the present invention suggest a structure with an extended active region to reduce the likelihood that a parasitic transistor will result. The extended active region blocks segregation of an impurity in a well. The active region is classified into an extended first active region 130a according to some embodiments of the present invention, and a second active region 130b corresponding to the active region of FIG. 1A, which are designated by a reference numeral 130.

Figure 3A:
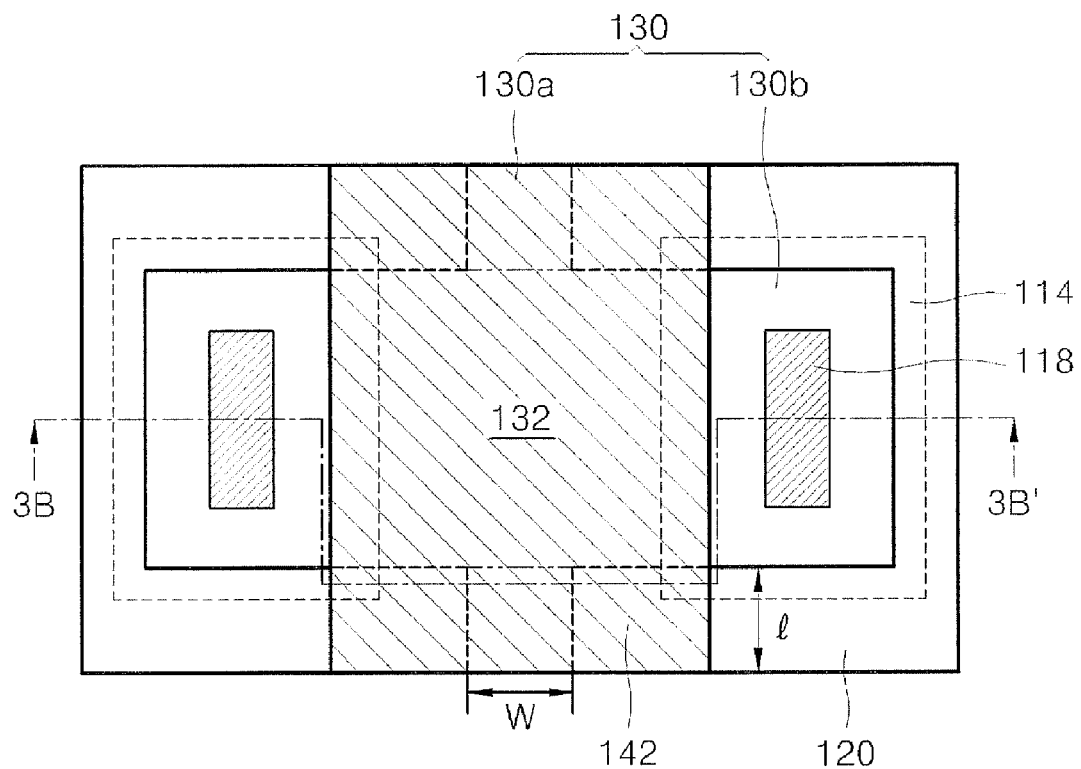
FIG. 3A is a plan view illustrating a structure of a high voltage transistor according to some embodiments of the present invention.
Figure 3B:
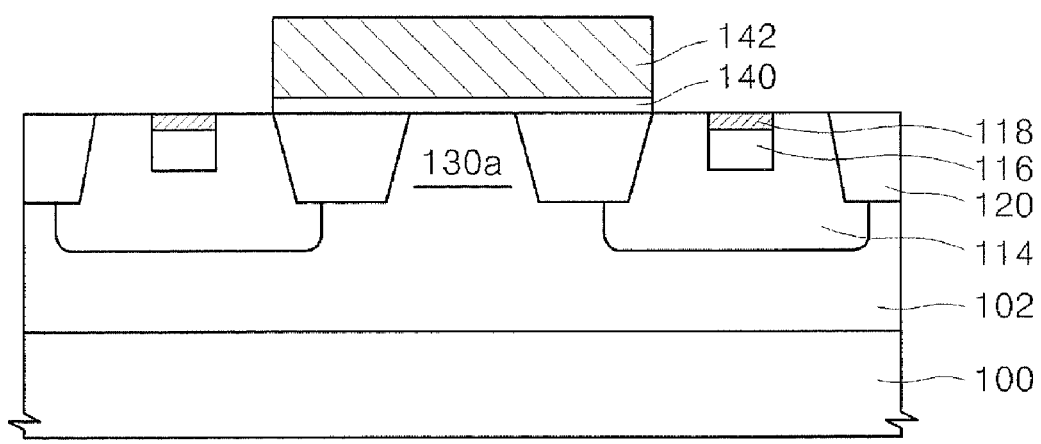
FIG. 3B is a cross section illustrating the high voltage transistor according to some embodiments of the present invention taken along a line 3B-3B' of FIG. 3A.

Referring first to FIGS. 3A and 3B, a plan view illustrating a structure of a high voltage transistor according to some embodiments of the present invention and a cross section illustrating the high voltage transistor according to some embodiments of the present invention taken along a line 3B-3B' of FIG. 3A will be discussed. In this case, the cutaway line 3B-3B' is drawn partially along an active region 130 and a device isolation film 120 for convenience of description. As illustrated in FIGS. 3A and 3B, a first well 102 doped with an impurity of a first conductivity type, for example, a p-type, is formed in a semiconductor substrate 100. A device isolation film 120 forming a field region defines an active region 130. A gate electrode 142 is formed on the semiconductor substrate 100 by interposing a gate insulating film 140 in a central portion of the active region 130. Furthermore, second wells 114 doped with an impurity of the second conductivity type, for example, an n-type, opposite to the first conductivity type are disposed in both sides of the gate electrode 142. The second well 114 is diffused partially to lower portions of the device isolation film 120 and the gate electrode 142.

The impurity of the first well 102 is varied in accordance with a kind of a transistor formed on an upper surface thereof. Thus, a p-type impurity is doped when the transistor is an NMOS type, or an n-type impurity is doped in case of a PMOS transistor. The p-type impurity may include, for example, boron (B) and indium (In), and the n-type impurity may include, for example, phosphorus (P) and arsenic (As). Furthermore, in the some embodiments of the present invention, the first well 102 may be doped with the impurity using ion implantation.

A source/drain region 116, separated from the gate electrode 142 by a predetermined distance, is formed within the second well 114, and a silicide layer 118 may be formed on the source/drain region 116 for improving conductivity. The second well 114 is formed because a punch-through voltage between the source/drain region 116 and the semiconductor substrate 100 is typically greater than a high voltage directly supplied to the source/drain region 116. In other words, a break-down voltage between the source/drain region 116 and the semiconductor substrate 100 or the first well 102 is greater than the high voltage. Therefore, the second well 114 is may be termed a drift region. The second well 114 defines a channel region 132 in a second active region 130b.

The source/drain region 116 is doped with an impurity of the second conductivity at a high density. The doping density of the second well 114 may be relatively higher than that of the first well 112, but relatively lower than that of the source/drain region 116. In the some embodiments of the present invention, a dose amount of the first well 102 was adjusted by $1.0 \times 10^{10}$ ions/cm$^2$, that of the second well 114 was $1.0 \times 10^{10}$ ions/cm$^2$, and that of the source/drain region 116 was $1.0 \times 10^5$ ions/cm$^2$.

Meanwhile, an impurity of the first well 102 has a different form from that doped into the source/drain region 116. For example, when the transistor is of an NMOS, the impurity of the first well 102 is a p-type impurity which includes an element of the group 3 in the periodic table, and the impurity of the second well 114 and the source/drain region 116 is an n-type impurity which includes an element of the group 5. When the transistor is of a PMOS, the impurity of the first well 102 is an n-type impurity, which includes an element of the group 5, and the impurity of the second well 114 and the source/drain region 116 is a p-type impurity which includes an element of the group 3. The p-type impurity may be boron (B), and the n-type impurity may be phosphorus (P).

The active region 130 of some embodiments of the present invention is classified into a first active region 130a and the second active region 130b. The first active region 130a is shaped as extending outwardly while having a predetermined width w and a length e around a central portion of the second active region 130b. The width w and the length e may be varied in accordance with a kind of the high voltage transistor. The width w may be narrower than a width of the gate electrode 142, and the first active region 130a may be covered with the gate electrode 142.

The first active region 130a may reduce the likelihood of the segregation of the impurity doped into the first well 102 by the high voltage and heat treatment. If the impurity is a p-type impurity, for example, boron (B), the likelihood of a density decrease of boron (B) around the device isolation film 120 may be reduced. Thus, the likelihood of forming of the parasitic transistor under the device isolation film 120 and at the edge thereof as described with reference to FIGS. 1A and 1B may be reduced.

Figure 1B:
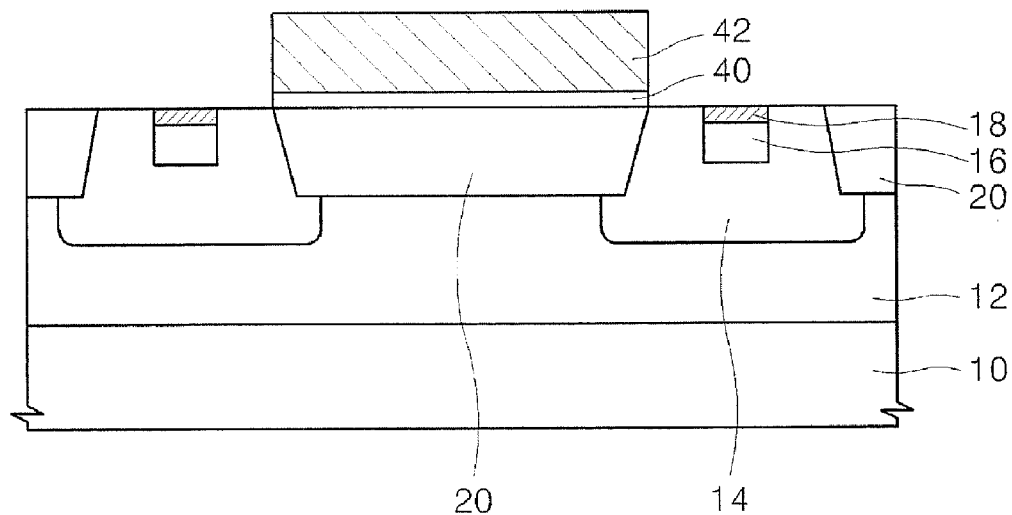
FIG. 1B is a cross section illustrating the high voltage transistor taken along a line 1B-1B' of FIG. 1A.
Figure 2:
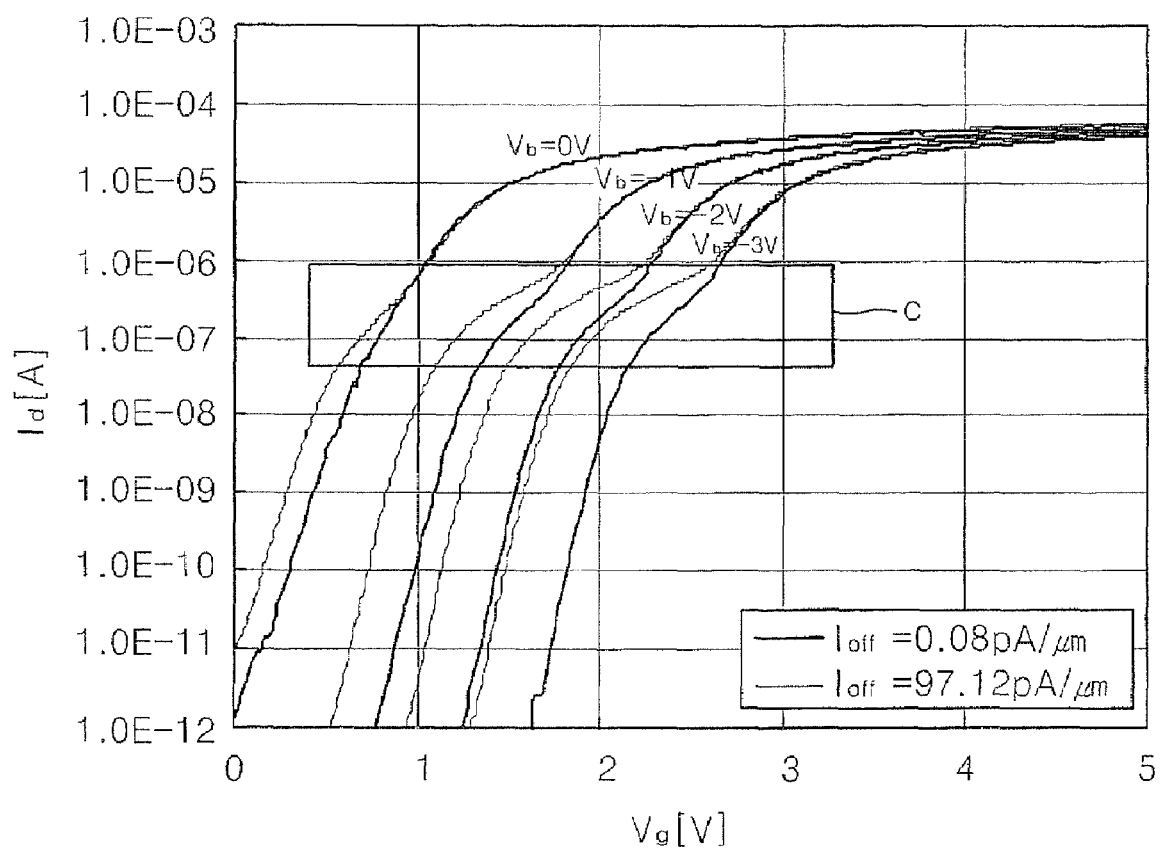
FIG. 2 is a graph plotting a relation of a drain current $I_d$ versus a gate voltage $V_g$ in order to check an influence of a parasitic transistor with respect to the conventional high voltage transistor.

The second active region 130b is similar to the active region 30 of FIG. 1A. More specifically, the second active region 130b has a structure including the source/drain region 116 and the channel region 132 and having a linear edge with no discontinuous portion that defines a certain region. The second active region 130b is a region where the transistor is actually operated.

FIGS. 4 through 7 are cross sections illustrating processing steps in the fabrication of high voltage transistors according to some embodiments of the present invention, which are obtained by taking along the line 3B-3B' of FIG. 3. The description will be provided in view of an NMOS, however, it will be understood that embodiments of the present invention are not limited by this description.

Figure 4:
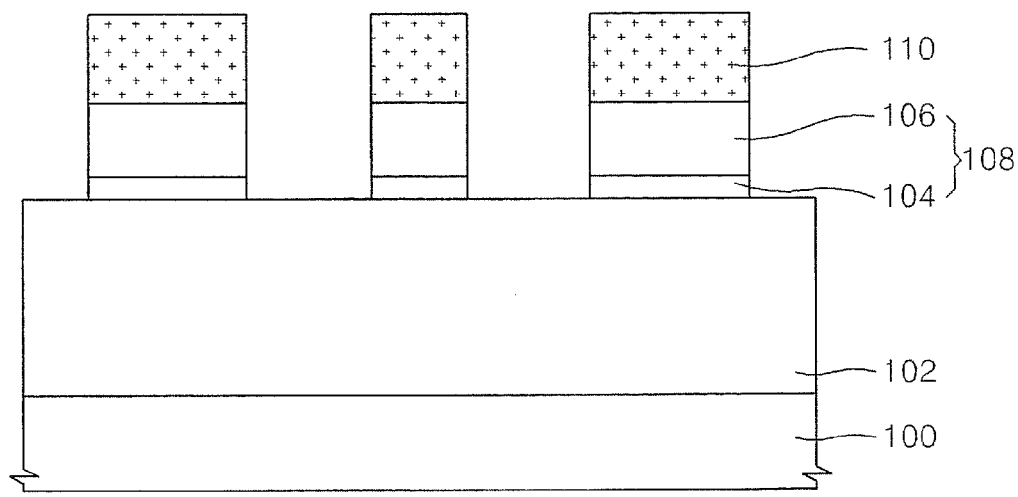
FIGS. 4 through 7 are cross sections illustrating processing steps in the fabrication of high voltage transistors according to some embodiments of the present invention.

Referring now to FIGS. 3A and 4, a first well 102 of a first conductivity type of, for example, a p-type impurity, is formed in a semiconductor substrate 100, for example, a silicon substrate. The first well 102 is formed at a does of about $1.0 \times 10^{10}$ ions/cm$^2$ using $BF_2$. A pad mask 108 formed of a pad oxide film 104 and a nitride film 106 for a hardmask is sequentially formed in a pattern type on the semiconductor substrate 100. The pad oxide film 104 formed to decrease a stress between the semiconductor substrate 100 and the nitride film 106 has a thickness of about 20~200 Å, and moreover about 100 Å. The nitride film 106 is used as a hardmask to form a device isolation region, which is deposited to a thickness of about 500~2000 Å, and moreover 800~850 Å. The deposition may include chemical vapor deposition (CVD), sub-atmospheric CVD (SACVD), low pressure CVD (LPCVD) or plasma enhanced CVD (PECVD).

In particular, the nitride film 106 and the pad oxide film 104 are etched by dry etching using a photoresist pattern 110 defining an active region 130 as a mask, thereby forming the pad mask 108. When etching the nitride film 106, a carbon fluoride-based gas is used. For example, CxFy-based and CaHbFc-based gas including $CF_4$, $CHF_3$, $C_2F_6$, $C_4F_8$, $CH_2F_2$, $CH_3F$, $CH_4$, $C_2H_2$ and $C_4F_6$ or a mixed gas of these gases is used. In this case, an ambient gas may be Ar gas.

Figure 5:
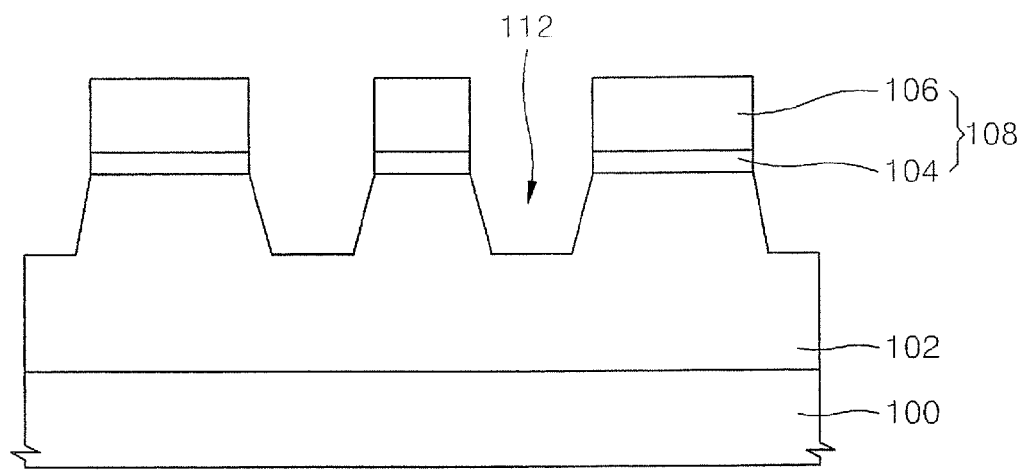

Referring now to FIGS. 3A and 5, after removing the photoresist pattern 110, the exposed semiconductor substrate 100 is anisotropically dry etched using the pad mask 108 as an etch mask, thereby forming a device isolation region 112 that defines the active region. The photoresist pattern 110 may be removed by a typical method of ashing using oxygen plasma and then organic stripping. The device isolation region 112 is deep enough to carry out the device isolation. As well known in the art, a sacrificial oxide film (not shown) and a nitride film liner (not shown) may be formed along an inner surface and a bottom surface of the device isolation region 112 and a sidewall of the pad oxide film 104.

Figure 6:
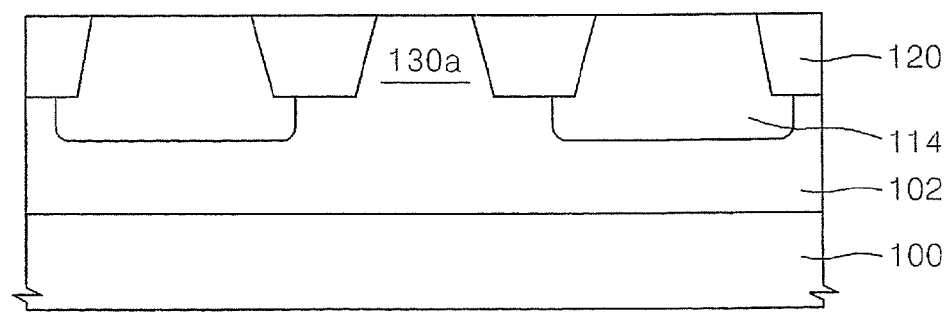

Referring now to FIGS. 3A and 6, the device isolation region 112 is filled with an insulating film, and then an upper surface thereof is planarized to form a device isolation film 120. An insulating film selected from the group consisting of an undoped silicate glass (USG) film, a high density plasma (HDP) oxide film, a tetra-ethyl-ortho-silicate (TEOS) film using PECVD, an oxide film using PECVD and a combination of these films may be used as the device isolation film 120. Among these films indicated as above, the HDP oxide film is most suitable for filling in the device isolation region 112. This is because the HDP oxide film has a compact film quality and a good gap-fill characteristic.

A first active region 130a is formed around a center portion of the active region 130 by the device isolation film 120. That is, the device isolation film 120 is separated by the first active region 130a. An upper surface of the first active region 130a is level with an upper surface of the second active region 130b, and doped with the same impurity. As illustrated in FIG. 6, the first active region 130a and the second active region 130b are defined by the device isolation film 120 and outwardly exposed.

Subsequently, a second well 114 having a second conductivity type of, for example, an n-type impurity, opposite to the first conductivity type is formed while defining the channel region 132. In some embodiments of the present invention, phosphorus (P) is used to have a dose amount of about $1.0 \times 10^{12}$ ions/cm$^2$. The second well 114 partially extends under the device isolation film 120.

Figure 7:
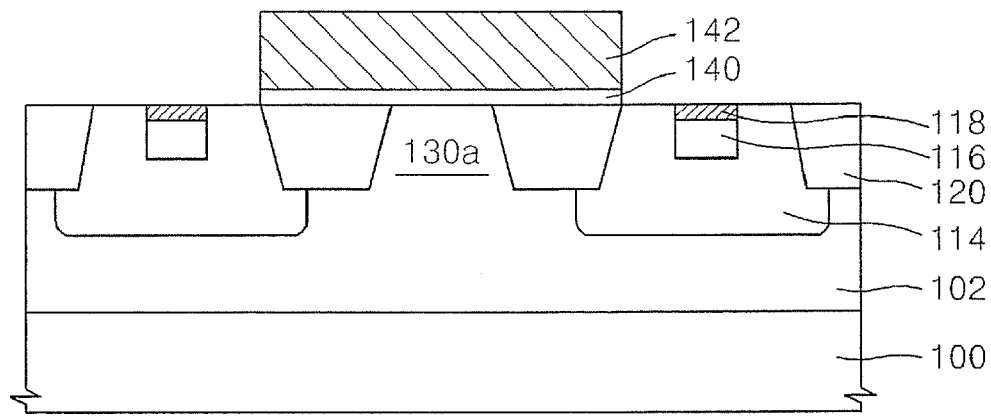

Referring now to FIGS. 3A and 7, a gate insulating film 140 and a gate electrode 142 extending portions of the channel region 132, the first active region 130a and the device isolation film 120 are sequentially formed. The gate insulating film 140 may be composed of silicon oxide or a metal oxide including titanium oxide, tantalum oxide, aluminum oxide, zirconium oxide and hafnium oxide. The gate electrode 142 may be a single layer or a composite layer composed of a material selected from the group consisting of amorphous polysilicon, doped polysilicon, and poly-SiGe and a conductive metal. The material containing the conductive metal may be selected from a metal such as tungsten and molybdenum or a conductive metal nitride such as titanium nitride film, a tantalum nitride film and a tungsten nitride film to form at least one layer.

A source/drain region 116 separated from the gate electrode 142 by a predetermined distance is formed within the second well 114 of the second active region 130b, and a silicide layer 118 may be formed on the source/drain region 116. The source/drain region 116 is doped with an impurity of the second conductivity type at a high density relatively higher than that of the second well 114. In some embodiments of the present invention, phosphorus (P) is used at a dose amount of $1.0 \times 10^{15}$ ions/cm$^2$.

Figure 8:
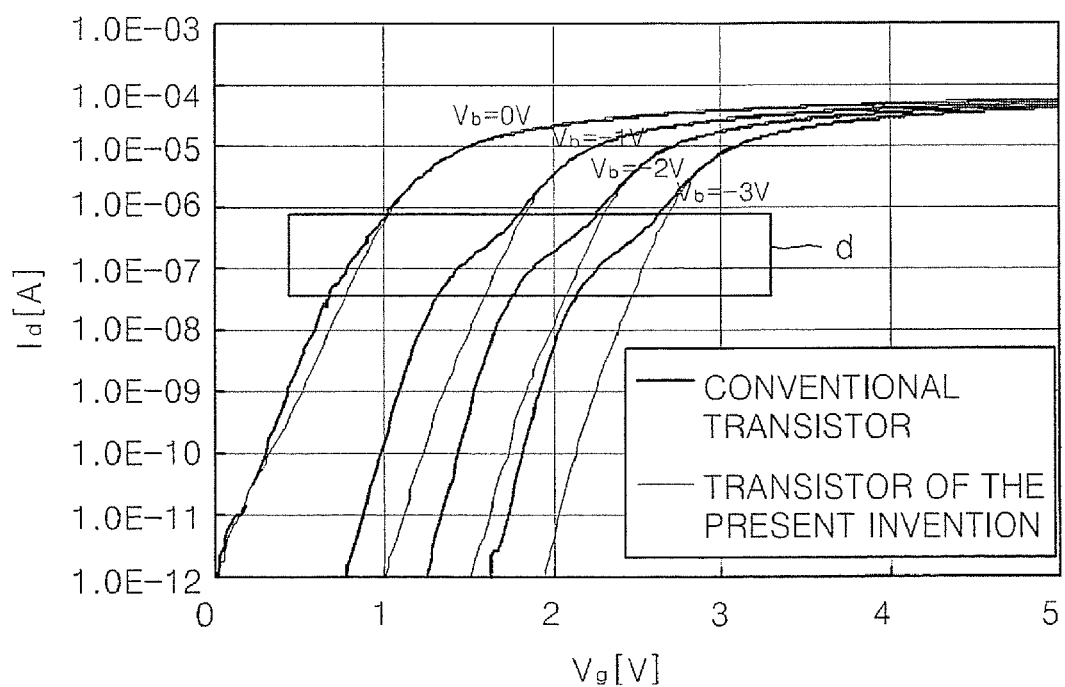
FIG. 8 is a graph plotting a relation of a drain current $I_d$ versus a gate voltage $V_g$ in order to compare the transistor according to some embodiments of the present invention to the conventional transistor.

Referring now to FIG. 8, a graph plotting a relation of a drain current $I_d$ versus a gate voltage $V_g$ in order to compare the transistor according to some embodiments of the present invention to the conventional transistor will be discussed. It was measured that a back bias voltage $V_b$ was varied from 0V to −3V. Thick solid lines correspond to the transistor according to some embodiments of the present invention, and thin solid lines correspond to a conventional transistor. A portion possibly involving a hump was emphasized by a rectangle d. In this case, a width w of the second active region was 1.0 μM and a length l thereof was 1.5 μm As illustrated, the transistor according to some embodiments of the present invention had a threshold voltage $V_{th}$ of roughly 1.06V and a saturated drain current $I_{d(sat)}$ of roughly 335 μA/μm to thereby involve no hump. However, a threshold voltage $V_{th}$ of the conventional transistor was roughly 1.08V and a saturated drain current $I_{d(sat)}$ was roughly 344 μA/μm, so that the hump phenomenon occurred. That is, the transistor of some embodiments of the present invention involves no segregation of the impurity around the device isolation film. Therefore, it can be noted that a parasitic transistor caused due to the segregation is not formed.

In a high voltage transistor and a method of fabricating the same according to some embodiments of the present invention, an extended active region is provided to inhibit forming of a parasitic transistor under a bottom surface and at an edge of the device isolation film, thereby reducing the likelihood that the hump will occur in a voltage-current curve.

While some embodiments of the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A high voltage transistor comprising:
   a semiconductor substrate;
   a device isolation film defining an active region in the semiconductor substrate;
   a gate electrode extending along a central portion of the active region while maintaining a predetermined width on the semiconductor substrate; and
   a second well formed on both sides of the gate electrode in the semiconductor substrate, and partially extending to a bottom surface of the device isolation film;
   a source region and a drain region separated from the gate electrode within the second well;
   wherein the active region in the semiconductor substrate comprises:
   a first active region disposed under the gate electrode, and separating the device isolation film; and
   a second active region defined by the first active region and the device isolation film,
   wherein the first active region extends outwardly around a central portion of the second active region; and
   wherein the second active region includes both the source region and the drain region and has an edge with no discontinuous portion from the source region to the drain region.

2. The high voltage transistor of claim 1, wherein the device isolation film is deep enough to carry out device isolation.

3. The high voltage transistor of claim 1, wherein the device isolation film comprises a high density plasma (HDP) oxide film.

4. The high voltage transistor of claim 1, wherein the gate electrode is provided on an entire surface of the first active region.

5. The high voltage transistor of claim 1, wherein the second well partially extends to both lower portions of the gate electrode.

6. The high voltage transistor of claim 1, wherein a width and a length of the first active region are determined by a type of the transistor.

7. The high voltage transistor of claim 1, wherein an upper surface of the first active region is level with an upper surface of the second active region.

8. The high voltage transistor of claim 1, further comprising source and drain regions separated from the gate electrode within the second well.

9. The high voltage transistor of claim 8, wherein the second well and the source and drain regions are doped with an impurity having a same conductivity type.

10. The high voltage transistor of claim 9, wherein the impurity comprises a group 5 element in the periodic table.

11. The high voltage transistor of claim 1, further comprising a first well including the active region and the device isolation film in an upper portion of the semiconductor substrate.

12. The high voltage transistor of claim 11, wherein the impurity doped into the first well has a conductivity type opposite to that of the second well.

13. The high voltage transistor of claim 12, wherein the impurity comprises a group 3 element in the periodic table.

14. The high voltage transistor of claim 13, wherein the impurity comprises boron (B).

15. The high voltage transistor of claim 12, wherein a doping density of the second well is greater than that of the first well.

* * * * *